United States Patent
Fudono et al.

(10) Patent No.: US 10,079,051 B2
(45) Date of Patent: Sep. 18, 2018

(54) INFORMATION PROCESSING TO REFRESH DATA STORED ON A DATA STORAGE APPARATUS

(71) Applicant: SONY CORPORATION, Tokyo (JP)

(72) Inventors: Kenji Fudono, Kanagawa (JP); Shusuke Saeki, Kanagawa (JP); Atsushi Ochiai, Tokyo (JP); Kazumi Sato, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 164 days.

(21) Appl. No.: 14/589,267

(22) Filed: Jan. 5, 2015

(65) Prior Publication Data
US 2015/0199394 A1    Jul. 16, 2015

(30) Foreign Application Priority Data
Jan. 10, 2014 (JP) .................. 2014-003437

(51) Int. Cl.
G11C 11/406 (2006.01)
G06F 11/14 (2006.01)

(52) U.S. Cl.
CPC ........ *G11C 11/40622* (2013.01); *G06F 11/14* (2013.01); *G11C 11/40611* (2013.01); *G06F 2212/7205* (2013.01); *G06F 2212/7207* (2013.01); *G06F 2212/7209* (2013.01)

(58) Field of Classification Search
CPC ............... G06F 17/30345; G06F 11/14; G06F 2212/7807; G06F 2212/7205; G11C 11/40611; G11C 11/40622
See application file for complete search history.

(56) References Cited

U.S. PATENT DOCUMENTS

| | | | |
|---|---|---|---|
| 2011/0161578 A1* | 6/2011 | Kim ...................... | G11C 11/406 711/106 |
| 2011/0197020 A1* | 8/2011 | Wakasa ................. | G11C 11/406 711/106 |
| 2012/0210076 A1* | 8/2012 | Jang ....................... | G11C 16/10 711/154 |

* cited by examiner

*Primary Examiner* — Matthew A Bradley
(74) *Attorney, Agent, or Firm* — Chip Law Group

(57) ABSTRACT

There is provided an information processing apparatus including a region detection unit configured to detect a region that satisfies a predetermined condition among a plurality of regions included in a data storage apparatus, and a refresh processing unit configured to skip refresh with respect to the region that satisfies the predetermined condition when performing refresh processing on the plurality of regions.

18 Claims, 16 Drawing Sheets

FIG.5
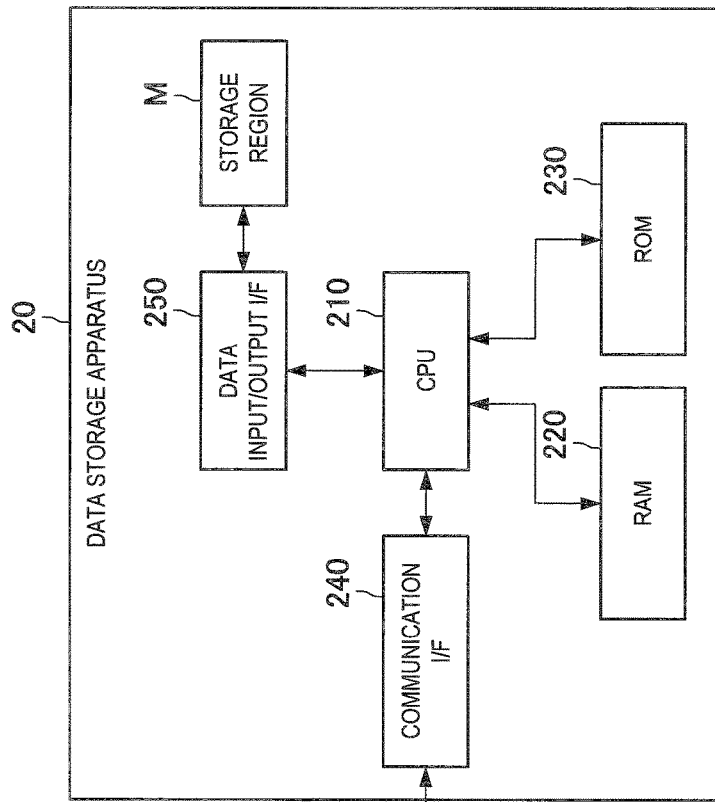
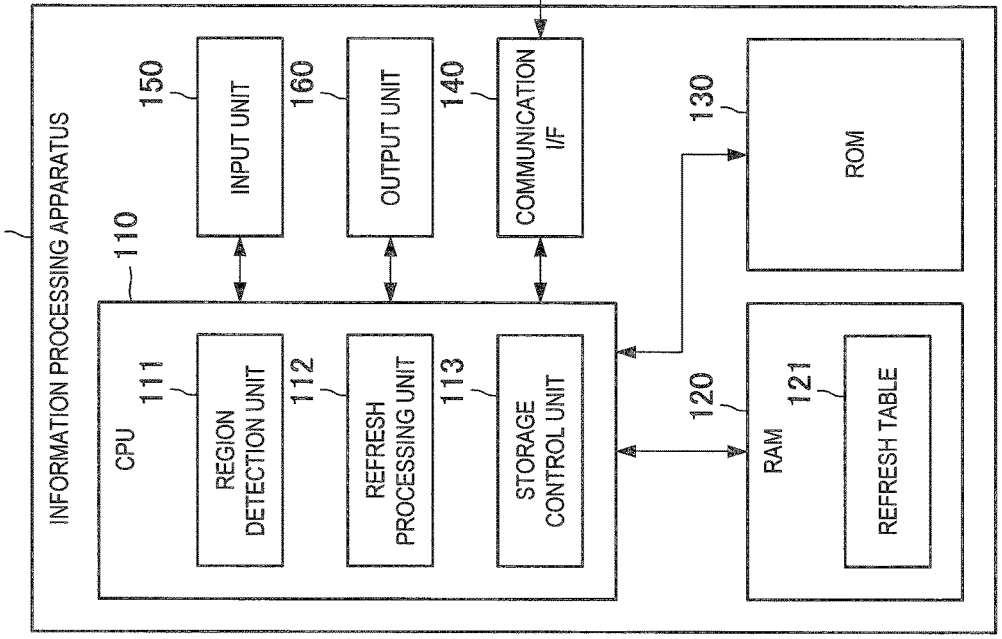

N : NECESSARY (INFORMATION SHOWING THAT REFRESH IS NECESSARY)

U : UNNECESSARY (INFORMATION SHOWING THAT REFRESH IS UNNECESSARY)

FIG. 7
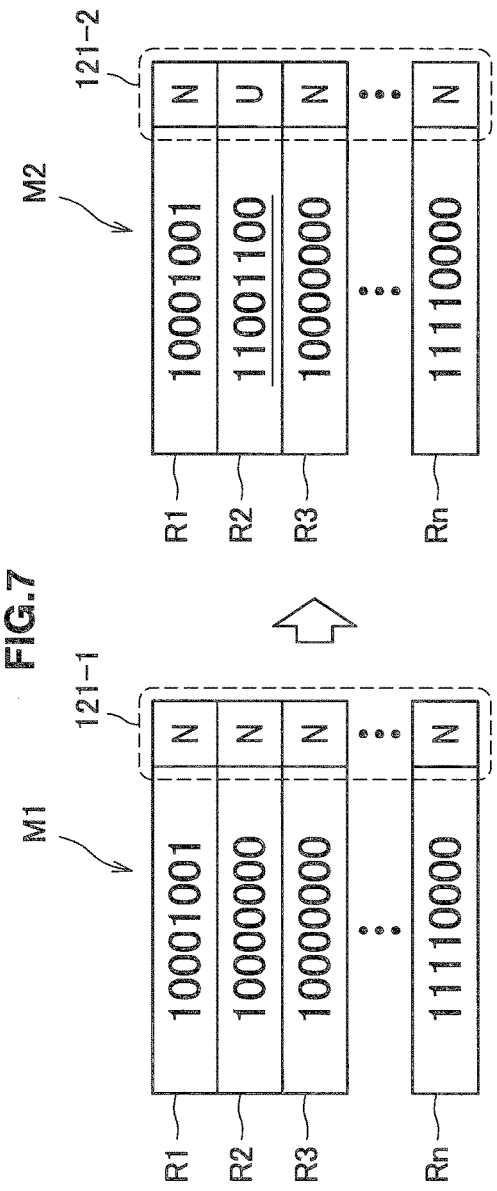
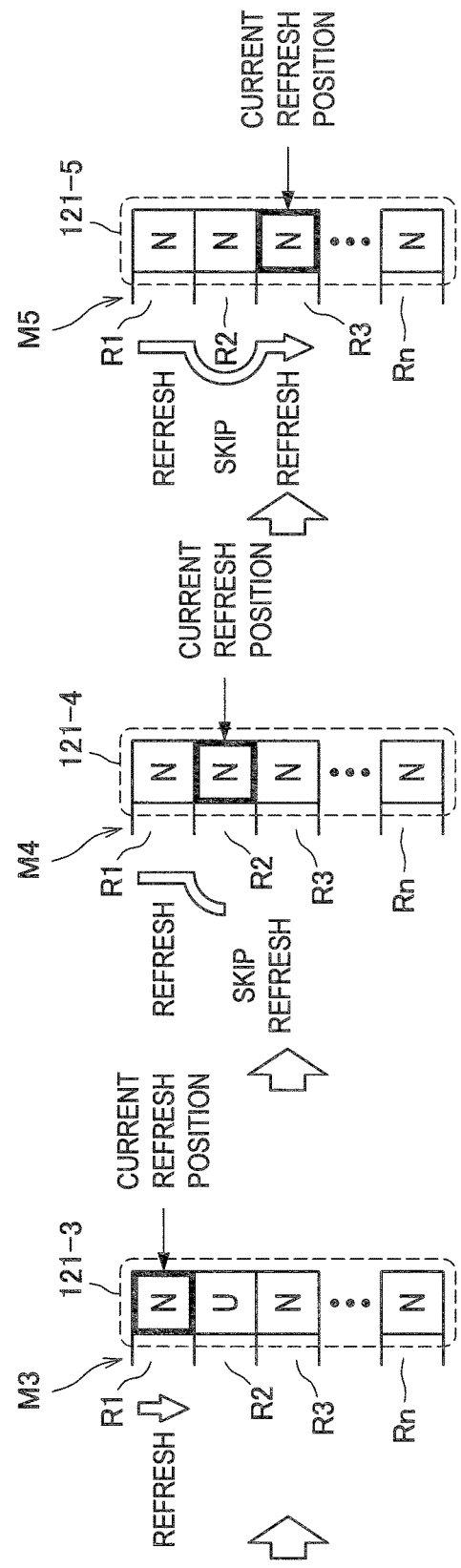

INFORMATION PROCESSING TO REFRESH DATA STORED ON A DATA STORAGE APPARATUS

CROSS REFERENCE TO RELATED APPLICATIONS

This application claims the benefit of Japanese Priority Patent Application JP 2014-003437 filed Jan. 10, 2014, the entire contents of which are incorporated herein by reference.

BACKGROUND

The present disclosure relates to an information processing apparatus, an information processing method and a recording medium.

Recently, various data storage apparatuses are widespread, but there is a case where data recorded in a data storage apparatus is lost when a period during which the data can be maintained passes. Therefore, a technique of performing refresh processing on the data storage apparatus is disclosed (for example, see JP 2010-67098A). The data recorded in the data storage apparatus may be restored by this refresh processing.

SUMMARY

However, it is desirable that a technique to perform refresh processing on a data storage apparatus more efficiently be provided.

According to an embodiment of the present disclosure, there is provided an information processing apparatus including a region detection unit configured to detect a region that satisfies a predetermined condition among a plurality of regions included in a data storage apparatus, and a refresh processing unit configured to skip refresh with respect to the region that satisfies the predetermined condition when performing refresh processing on the plurality of regions.

According to an embodiment of the present disclosure, there is provided an information processing method including detecting a region that satisfies a predetermined condition among a plurality of regions included in a data storage apparatus, and skipping, by a processor, refresh with respect to the region that satisfies the predetermined condition when performing refresh processing on the plurality of regions.

According to an embodiment of the present disclosure, there is provided a non-transitory computer-readable recording medium having a program recorded therein, the program causing a computer to function as an information processing apparatus including a region detection unit configured to detect a region that satisfies a predetermined condition among a plurality of regions included in a data storage apparatus, and a refresh processing unit configured to skip refresh with respect to the region that satisfies the predetermined condition when performing refresh processing on the plurality of regions.

As described above, according to an embodiment of the present disclosure, it is possible to perform refresh processing on a data storage apparatus more efficiently. Here, the above-mentioned effect is not limited at any time, and any of effects shown in this specification or other effects that can be understood from this specification may be provided together with the above-mentioned effect or instead of the above-mentioned effect.

BRIEF DESCRIPTION OF THE DRAWINGS

FIG. 5 is a diagram illustrating a functional configuration example of an information processing system according to the embodiment;

FIG. 7 is a diagram to describe an example of skipping the refresh of a data writing region;

DETAILED DESCRIPTION OF THE EMBODIMENT(S)

Figure 1:
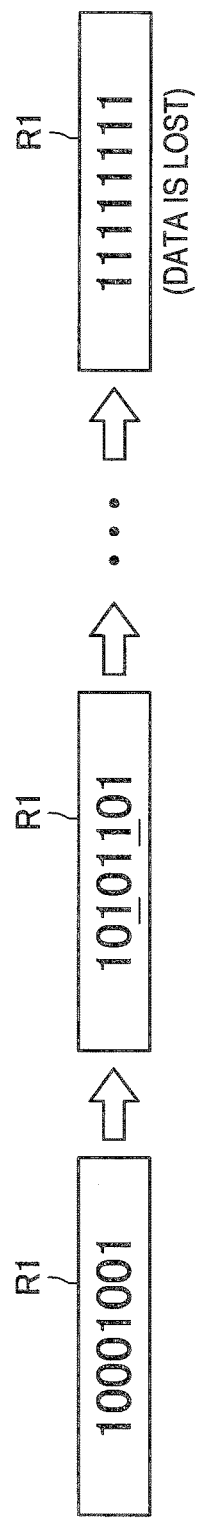
FIG. 1 is the first diagram to describe the outline of an embodiment of the present disclosure.

Hereinafter, preferred embodiments of the present disclosure will be described in detail with reference to the appended drawings. Note that, in this specification and the appended drawings, structural elements that have substantially the same function and structure are denoted with the same reference numerals, and repeated explanation of these structural elements is omitted.

Moreover, in the specification and the appended drawings, there is a case where a plurality of structural elements that have substantially the same function and structure are distinguished by being denoted with different letters or digits following the same reference numeral. However, in a case where each of structural elements that have substantially the same function and structure does not have to be especially distinguished, only the same reference numeral is assigned.

Note that description will be provided in the following order.
1. Outline of embodiment
2. Example of function and structure of information processing system
3. Details of function of information processing system
4. Hardware configuration example of information processing apparatus
5. Conclusion

<1. Outline of Embodiment>

First, the outline of an embodiment of the present disclosure is described. FIG. 1 is the first diagram to describe the outline of the embodiment of the present disclosure. Referring to FIG. 1, a change example of data written in region R1 included in a data storage apparatus is shown. As illustrated in FIG. 1, the data written in region R1 is correctly "10001001". However, for example, in a case where a period during which data can be maintained (which may be referred to as "retention" below) passes, there is a case where the data written in region R1 changes to something like "10101101", . . . , "11111111".

Figure 2:
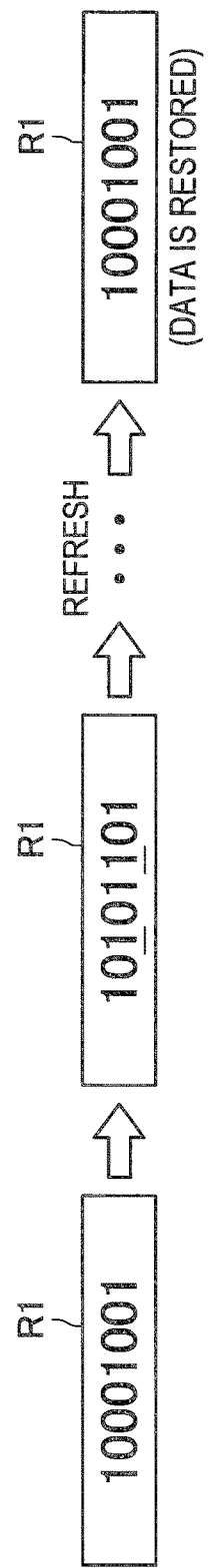
FIG. 2 is the second diagram to describe the outline of the embodiment.

A phenomenon in which the data changes in this way may occur in, for example, a storage region of a semiconductor storage apparatus. FIG. 2 is the second diagram to describe the outline of an embodiment of the disclosure. Referring to FIG. 2, similar to the example illustrated in FIG. 1, a change example of data written in region R1 included in a data storage apparatus is shown. Moreover, similar to the example illustrated in FIG. 1, the data written in region R1 is correctly "10001001". However, the data written in region R1 has changed to something like "10101101".

Therefore, if it is designed to rewrite (which may be referred to as "refresh" below) data with respect to region R1, it is possible to reduce a possibility that the data written in region R1 changes. Here, as a refresh example, FIG. 2 illustrates an example of restoring the data written in region R1 to correct data. A technique of data restoration is not especially limited and may be a technique of treating data in which an error part detected by a predetermined error detection technique is corrected, as correct data. However, the refresh may not have a function to restore the data written in region R1 to correct data, and only has to include a function to replenish at least region R1 with an electrical charge.

Figure 3:
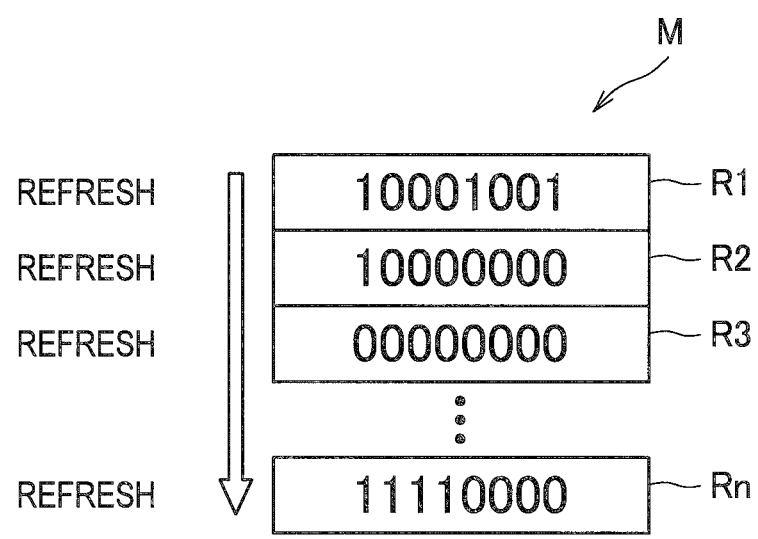
FIG. 3 is the third diagram to describe the outline of the embodiment.

FIG. 3 is the third diagram to describe the outline of an embodiment of the present disclosure. Referring to FIG. 3, storage region M included in a data storage apparatus is shown. Moreover, referring to FIG. 3, storage region M includes a plurality of regions (regions R1 to Rn, where n is an integer equal to or greater than 2). Here, to reduce a possibility that the data written in storage region M is lost, refresh (which may be referred to as "refresh processing" below) with respect to storage region M may be performed. For example, as illustrated in FIG. 3, the refresh may be sequentially performed on each of regions R1 to Rn. Moreover, the refresh processing may be performed every predetermined period, but the timing at which the refresh processing is performed is not especially limited.

Figure 4:
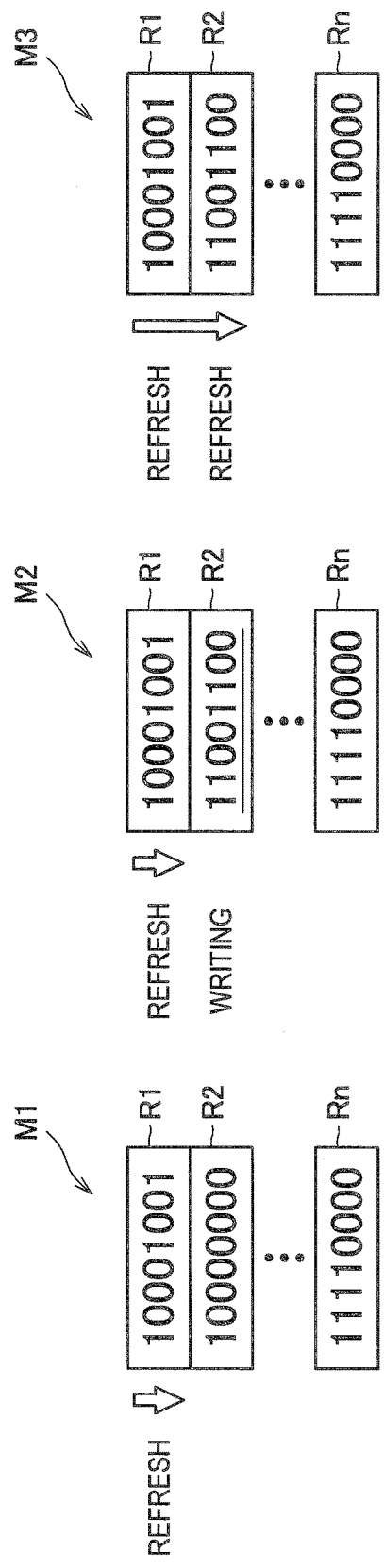
FIG. 4 is the fourth diagram to describe the outline of the embodiment.

FIG. 4 is the fourth diagram to describe the outline of an embodiment of the present disclosure. Referring to FIG. 4, the time change of storage region M included in a data storage apparatus (storage regions M1 to M3) is illustrated. Moreover, referring to FIG. 4, storage region M includes regions R1 to Rn. Here, as illustrated in FIG. 4, a case is assumed where refresh is sequentially performed on each of regions R1 to Rn. In this case, as illustrated in storage region M2, a case is assumed where the writing of data with respect to region R2 is performed before the refresh with respect to region R2 is performed.

In this case, as illustrated in storage region M3, it is assumed that the refresh is performed even on region R2 in which the writing of data has been performed, but it is assumed that data existing in region R2 is less likely to change by the writing. Therefore, as one example, it is considered that the refresh with respect to region R2 in which the writing of data has been performed may be skipped. Like this example, this specification proposes a technique to perform refresh processing on a data storage apparatus more efficiently. The outline of an embodiment of the present disclosure has been described above.

<2. Functional Configuration Example of Information Processing System>

Subsequently, a functional configuration example of an information processing system 1 according to an embodiment of the present disclosure is described. FIG. 5 is a diagram illustrating a functional configuration example of the information processing system 1 according to an embodiment of the present disclosure. As illustrated in FIG. 5, the information processing system 1 includes an information processing apparatus 10 and a data storage apparatus 20.

Moreover, as illustrated in FIG. 5, the information processing apparatus 10 includes a central processing unit (CPU) 110, a random access memory (RAM) 120, a read only memory (ROM) 130, a communication interface 140, an input unit 150 and an output unit 160. Moreover, as illustrated in FIG. 5, the data storage apparatus 20 includes a CPU 210, a RAM 220, a ROM 230, a communication interface 240, a data input/output interface 250 and storage region M.

The CPU 110 fulfills various functions by executing a program stored in the ROM 130 or other storage media. As illustrated in FIG. 5, by the execution of the program by the CPU 110, the function of each function block such as a region detection unit 111, a refresh processing unit 112 and a storage control unit 113 may be realized. Details of the functions of these function blocks are described later. Here, instead of the CPU 110, processors such as a graphics processing unit (GPU), a digital signal processor (DSP) and a system on chip (SoC) may be used.

The RAM 120 temporarily stores, for example, a program used in the execution of the CPU 110 or a parameter that appropriately changes in the execution. Referring to FIG. 5, the RAM 120 stores a refresh table 121. The refresh table 121 is described later in detail. The ROM 130 stores, for example, a program or operation parameter used by the CPU 110. The communication interface 140 is an interface that performs communication with the data storage apparatus 20.

The input unit 150 includes an operation unit to input user operation and an input control circuit to generate an input signal on the basis of the user operation and output the input signal to the CPU 110, and so on. By operating the input unit 150, the user can input various kinds of data or instruct processing operation to the information processing apparatus 10. Here, the positions in which these operation units are installed are not especially limited. For example, the relevant operation unit may be installed in the chassis side surface of the information processing apparatus 10 or may be installed on the same surface as a surface in which a display is installed.

For example, the output unit 160 may include a display apparatus such as a liquid crystal display (LCD), an organic light emitting diode (OLED) and a lamp. In addition, the output unit 160 may include an audio output apparatus such as a speaker and headphones. For example, the display apparatus may display a photographed image or a generated image. Meanwhile, the audio output apparatus may convert audio data or the like into audio and output the audio.

The CPU 210 fulfills various functions by executing a program stored in the ROM 230 or other storage media. Here, processors such as GPU, DSP, and SoC may be used instead of the CPU 210. The RAM 220 temporarily stores, for example, a program used in the execution of the CPU 210 or a parameter that appropriately changes in the execution. The ROM 230 stores, for example, a program or operation parameter used by the CPU 210. The communication interface 240 is an interface that performs communication with the information processing apparatus 10.

The data input/output interface 250 is an interface to read out data from storage region M and write data in storage region M. Storage region M has a plurality of regions. In this specification, a plurality of regions included in storage region M are shown as regions R1 to Rn (herein, n is an integer equal to or greater than 2). Here, in a case where a nonvolatile memory is used as the data storage apparatus 20, storage region M may be a nonvolatile storage element such as an NAND-type flash. The data storage apparatus 20 may be a volatile memory. A functional configuration example of the information processing system 1 according to an embodiment of the present disclosure has been described above.

<3. Details of Function of Information Processing System>

Subsequently, details of function of the information processing system 1 according to an embodiment of the present disclosure are described. In the embodiment of the present disclosure, the region detection unit 111 detects a region that satisfies a predetermined condition among regions R1 to Rn. Moreover, when performing refresh processing on storage region M, the refresh processing unit 112 skips the refresh with respect to the region that satisfies the predetermined condition. By this configuration, it becomes possible to perform refresh processing on the data storage apparatus 20 more efficiently. Moreover, since it becomes possible to omit useless refresh, it becomes possible to reduce a possibility of disturbing data writing operation to storage region M and data readout operation from storage region M, and extend the lifetime of the data storage apparatus 20 in which there is a limitation in the rewriting cycles. The predetermined condition is described later in detail.

Figure 6:
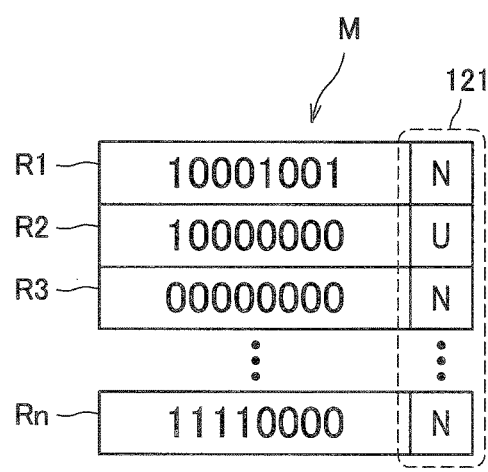
FIG. 6 is a diagram to describe a refresh table.

In particular, in this specification, a case is described where refresh necessity/unnecessity information (which may be simply referred to as a "flag" below) that is information showing the necessity/unnecessity of refresh associated with each of regions R1 to Rn is used. These flags may be stored as the refresh table 121. FIG. 6 is a diagram to describe the refresh table 121. As illustrated in FIG. 6, as information set to a flag, for example, information showing that refresh is necessary and information showing that the refresh is unnecessary are assumed.

For example, the region detection unit 111 only has to set information showing that the refresh is unnecessary, to a flag associated with a region that satisfies a predetermined condition among regions R1 to Rn. Further, when performing refresh processing on storage region M, the refresh processing unit 112 only has to skip refresh with respect to the region associated with the information showing that the refresh is unnecessary. Meanwhile, the refresh processing unit 112 only has to perform refresh on a region associated with the information showing that the refresh is necessary, without skipping the refresh.

A concrete example is described with reference to FIG. 6. First, a case is assumed where information showing that refresh is necessary is set to a flag showing the necessity/unnecessity of refresh associated with each of regions R1 to Rn. In this case, in a case where region R2 that satisfies a predetermined condition is detected by the region detection unit 111, the refresh processing unit 112 only has to set information showing that the refresh is unnecessary to a flag associated with region R2 that satisfies the predetermined condition as illustrated in FIG. 6.

Subsequently, when performing refresh processing on storage region M, the refresh processing unit 112 only has to skip the refresh with respect to region R2 associated with the information showing that the refresh is unnecessary. Meanwhile, when performing the refresh processing on storage region M, the refresh processing unit 112 only has to perform refresh on each of regions R1 and R3 to Rn associated with the information showing that the refresh is necessary, without skipping the refresh.

Here, in this specification, a case where the refresh table 121 is stored by the RAM 120 is described as an example as illustrated in FIG. 5, but the refresh table 121 may be stored by other storage apparatuses than the RAM 120. For example, the refresh table 121 may be stored by the RAM 220 of the data storage apparatus 20. Moreover, as described later, the refresh table 121 may move between the RAM 120 and the RAM 220.

The above-mentioned predetermined condition is not especially limited. For example, a region that satisfies the predetermined condition may include at least a region specified by user operation. Here, the region specified by the user operation may be a region directly specified by the user operation or may be a region used for processing caused by the user operation.

For example, the region specified by the user operation may include at least a region in which data writing caused by the user operation is performed (which may be referred to as "data writing region" below) among regions R1 to Rn. It is because it is assumed that data existing in the data writing region is less likely to change by writing.

It is assumed that the data existing in the data writing region is less likely to change by writing, but there is a case where the data is lost when a period during which the data can be maintained passes. Therefore, the refresh processing unit 112 may skip refresh with respect to the data writing region and set information showing that the refresh is necessary to the flag associated with the data writing region.

A concrete example is described with reference to FIG. 7. FIG. 7 is a diagram to describe an example of skipping refresh of the data writing region. Referring to FIG. 7, the time change of storage region M (storage regions M1 to M5) is shown, and the time change of the refresh table 121 (refresh tables 121-1 to 121-5) is shown. Each data is written in each of regions R1 to Rn included in storage region M1. Moreover, referring to the refresh table 121-1, information showing that refresh is necessary is set to the flag associated with each of regions R1 to Rn.

In this case, when data writing with respect to region R2 is caused by user operation as illustrated in storage region M2, data writing region R2 is detected by the region detection unit 111. When data writing region R2 is detected by the region detection unit 111, as illustrated in FIG. 7, the region detection unit 111 sets information showing that the refresh is unnecessary to the flag associated with data writing region R2.

Subsequently, the refresh processing unit 112 refers to the refresh table 121-3, and, when performing refresh processing on storage region M3, performs refresh on region R1 associated with information showing that the refresh is necessary, without skipping the refresh. Subsequently, the refresh processing unit 112 refers to the refresh table 121-3 and skips refresh with respect to region R2 associated with information showing that the refresh is unnecessary.

Moreover, the refresh processing unit 112 sets information showing that the refresh is necessary to the flag associated with region R2 included in storage region M4 as illustrated in the refresh table 121-4. Subsequently, the refresh processing unit 112 refers to the refresh table 121-5 and performs refresh on regions R3 to Rn associated with information showing that the refresh is necessary, without skipping the refresh. An example of skipping the refresh of a data writing region has been described with reference to FIG. 7.

Figure 8:
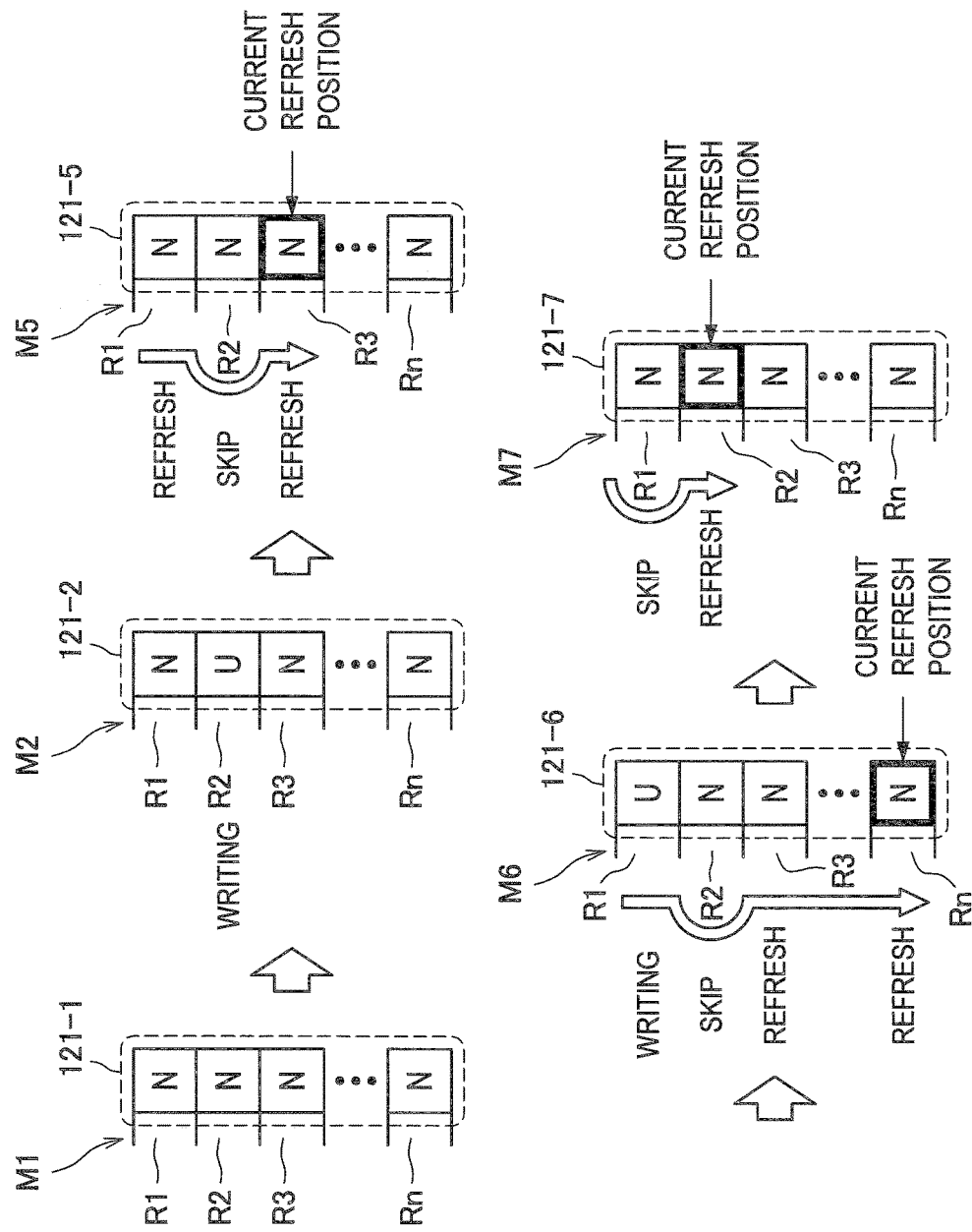
FIG. 8 is a diagram to describe an example in a case where repeated refresh processing is performed.

Subsequently, an example case where repetitive refresh processing is performed is described with reference to FIG. 8. FIG. 8 is a diagram to describe an example case where the repetitive refresh processing is performed. Referring to FIG. 8, the time change of storage region M (storage regions M1, M2 and M5 to M7) is illustrated, and the time change of the refresh table 121 (refresh tables 121-1, 121-2 and 121-5 to 121-7) is illustrated. Here, a case is assumed where the first refresh processing is performed in the same way as the example illustrated in FIG. 7.

As illustrated in storage region M6, when data writing with respect to region R1 is caused by user operation during the first refresh processing of M1 to M5 (or after the first refresh processing of M1 to M5 ends), data writing region R1 is detected by the region detection unit 111. When data writing region R1 is detected by the region detection unit 111, as illustrated in FIG. 8, the region detection unit 111 sets information showing that refresh is unnecessary to the flag associated with data writing region R1.

Subsequently, the refresh processing unit 112 refers to the refresh table 121-6, and, when performing refresh processing on storage region M6, skips refresh with respect to region R1 associated with information showing that the refresh is unnecessary. Moreover, as illustrated in the refresh table 121-7, the refresh processing unit 112 sets information showing that the refresh is necessary to the flag associated with region R1 included in storage region M7.

Subsequently, the refresh processing unit 112 refers to the refresh table 121-7 and performs refresh on regions R2 to Rn associated with information showing that the refresh is necessary, without skipping the refresh. An example case where repetitive refresh processing is performed has been described with reference to FIG. 8.

A case has been described above where a region specified by user operation includes a data writing region, but the region specified by the user operation may include at least a region in which data readout caused by the user operation is performed (which may be referred to as "data readout region" below) among regions R1 to Rn instead of the data writing region or in addition to the data writing region. It is because, in a case where a data storage apparatus automatically performs data restoration processing by readout, it is assumed that data existing in the data readout region is less likely to change by the readout.

It is assumed that the data existing in the data readout region is less likely to change by readout, but there is a case where the data is lost when a period during which the data can be maintained passes. Therefore, the refresh processing unit 112 may skip refresh with respect to the data readout region and set information showing that the refresh is necessary to a flag associated with the data readout region.

Moreover, the region specified by the user operation may include at least a region in which data discard (such as file deletion) caused by the user operation is performed (which may be referred to as "data discard region" below) among regions R1 to Rn. Moreover, it is because a case is assumed where it is not inconvenient for the user even if data existing in the data discard region changes.

Moreover, a case is assumed where it is not inconvenient for the user even if the data existing in the data discard region changes, and therefore the data discard region may not be permanently refreshed. Therefore, the refresh processing unit 112 may skip refresh with respect to the data discard region and may not set information showing that the refresh is necessary to a flag associated with the data discard region.

Figure 9:
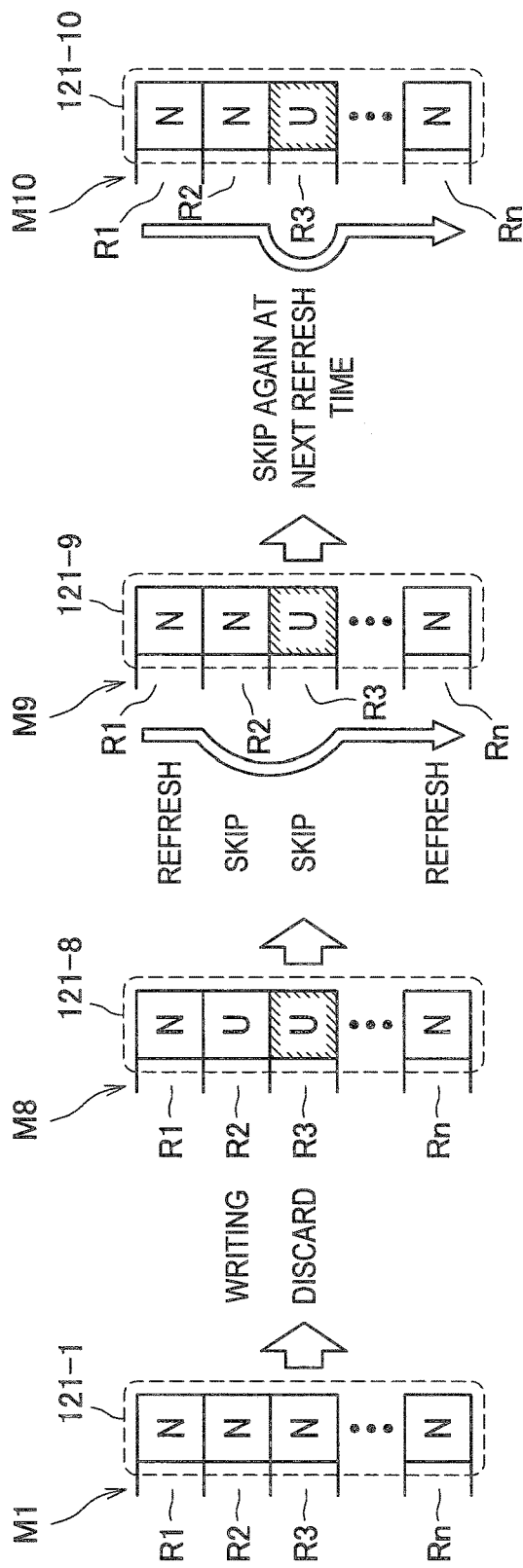
FIG. 9 is a diagram to describe an example of skipping the refresh of a data discard region.

A concrete example is described with reference to FIG. 9. FIG. 9 is a diagram to describe an example of skipping refresh of a data discard region. Referring to FIG. 9, the time change of storage region M (storage regions M1 and M8 to M10) is illustrated, and the time change of the refresh table 121 (refresh tables 121-1 and 121-8 to 121-10) is illustrated. Each data is written in each of regions R1 to Rn included in storage region M1. Moreover, referring to the refresh table 121-1, information showing that refresh is necessary is set to the flag associated with each of regions R1 to Rn.

In this case, as illustrated in storage region M8, when data writing with respect to region R2 is caused by user operation, data writing region R2 is detected by the region detection unit 111. When data writing region R2 is detected by the region detection unit 111, as illustrated in FIG. 9, the region detection unit 111 sets information showing that the refresh is unnecessary (information showing that immediate refresh is unnecessary) to a flag associated with data writing region R2.

Moreover, as illustrated in storage region M8, when data discard with respect to region R3 is caused by user operation, data discard region R3 is detected by the region detection unit 111. When data discard region R3 is detected by the region detection unit 111, as illustrated in FIG. 9, the region detection unit 111 sets information showing that the refresh is unnecessary (information showing that the refresh is permanently unnecessary) to a flag associated with data discard region R3.

Subsequently, the refresh processing unit 112 refers to the refresh table 121-8, and, when performing refresh processing on storage region M8, performs refresh on region R1 associated with information showing that the refresh is necessary, without skipping the refresh.

Subsequently, the refresh processing unit 112 refers to the refresh table 121-8 and skips refresh with respect to region R2 associated with information showing that the refresh is unnecessary (information showing that immediate refresh is unnecessary). Moreover, as illustrated in the refresh table 121-9, the refresh processing unit 112 sets information showing that the refresh is necessary to a flag associated with region R3 included in storage region M9.

Subsequently, the refresh processing unit 112 refers to the refresh table 121-8 and skips refresh with respect to region R3 associated with information showing that the refresh is unnecessary (information showing that the refresh is permanently unnecessary). Moreover, as illustrated in the refresh table 121-9, the refresh processing unit 112 keeps information showing that the refresh is unnecessary (information showing that the refresh is permanently unnecessary) to be set to the flag associated with region R2 included in storage region M9.

Subsequently, the refresh processing unit 112 refers to the refresh table 121-9 and performs refresh on regions with which information showing that the refresh is necessary (from the region next to region R3 to region Rn) is associated, without skipping the refresh.

Subsequently, when performing refresh processing on storage region M10, the refresh processing unit 112 refers to the refresh table 121-10 and performs refresh on region R2 associated with information showing that the refresh is necessary, without skipping the refresh. Meanwhile, the refresh processing unit 112 skips refresh with respect to region R3 associated with information showing that the refresh is unnecessary (information showing that the refresh is permanently unnecessary).

Figure 10:
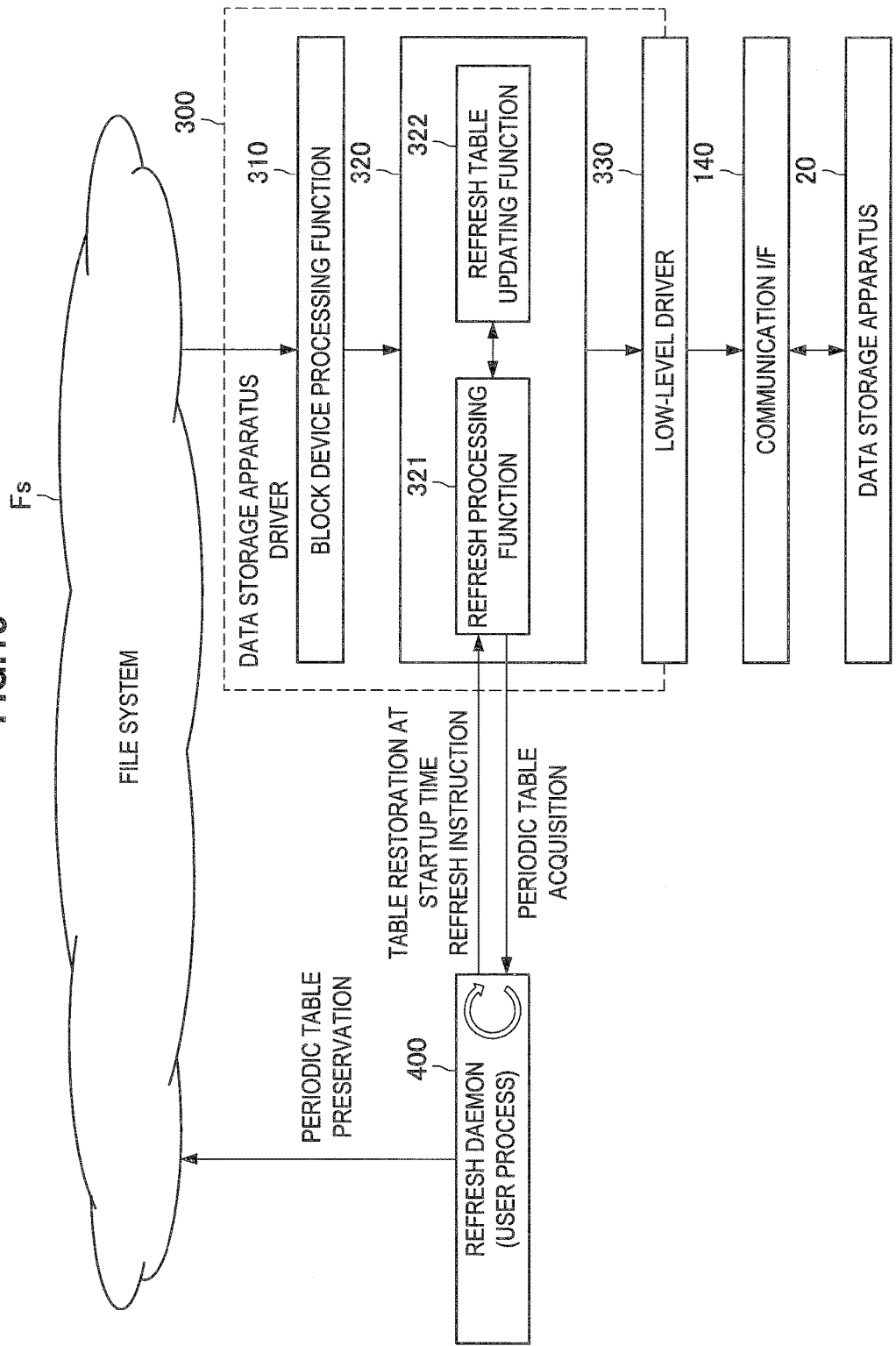
FIG. 10 is a diagram illustrating a software configuration example of an information processing apparatus according to the embodiment.

An example of skipping the refresh of a data discard region has been described with reference to FIG. 9. Subsequently, a software configuration example of the information processing apparatus 10 is described with reference to FIG. 10. FIG. 10 is a diagram illustrating a configuration example of the information processing apparatus 10 according to an embodiment of the present disclosure. As illustrated in FIG. 10, the information processing apparatus 10 may include a refresh daemon 400 which may correspond to a user process, file system Fs, a data storage apparatus driver 300 and the communication interface 140.

Moreover, as illustrated in FIG. 10, the data storage apparatus driver 300 may have, for example, a block device processing function 310 that receives an access request from file system Fs, a function 320 that performs logical processing or the like according to the characteristic of the data storage apparatus 20, and a low-level driver 330 that controls hardware. Moreover, the function 320 may have, for example, a refresh processing function 321 that performs refresh processing and a refresh table updating function 322 that updates the refresh table 121.

As illustrated in FIG. 10, the refresh daemon 400 periodically acquires the refresh table 121 from the refresh table updating function 322 and can refer to and update the acquired refresh table 121. Moreover, the refresh daemon 400 can cause the refresh table updating function 322 to periodically preserve the refresh table 121 via file system Fs. Moreover, as illustrated in FIG. 10, when performing refresh processing, the refresh daemon 400 can give a refresh instruction to the refresh processing function 321.

Moreover, as illustrated in FIG. 10, the refresh daemon 400 can give an instruction to the refresh table updating function 322 so as to cause the data storage apparatus 20 to store the refresh table 121 before the power source of the information processing apparatus 10 is disconnected. Moreover, the refresh daemon 400 can give an instruction to the refresh table updating function 322 so as to restore the refresh table 121 from the data storage apparatus 20 when the information processing apparatus 10 starts up.

Figure 11:
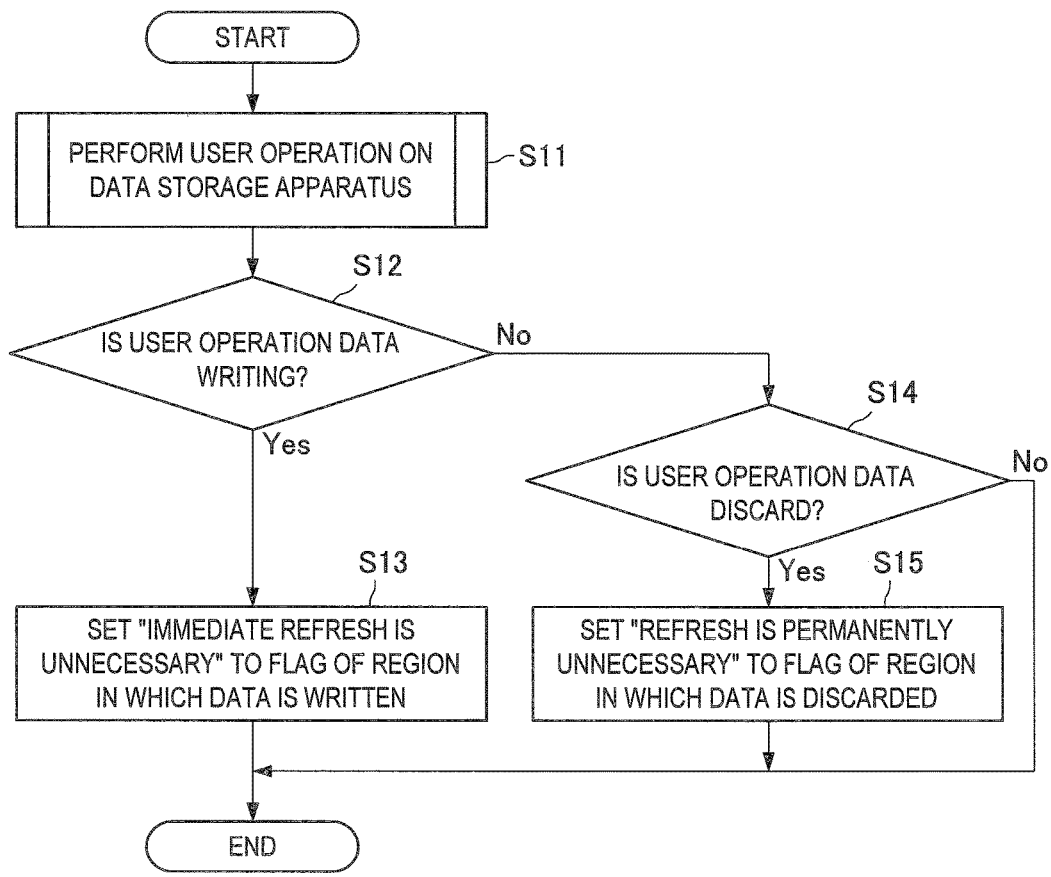
FIG. 11 is a flowchart illustrating an operation example of updating a refresh table.

Subsequently, the flow of operation of the information processing apparatus 10 according to an embodiment of the present disclosure is described. First, the flow of operation to update the refresh table 121 is described. FIG. 11 is a flowchart illustrating an operation example of updating the refresh table. Here, the flow of operation illustrated in FIG. 11 merely shows one example of the flow of operation to update the refresh table 121. Therefore, the flow of operation to update the refresh table 121 is not limited to the example illustrated in FIG. 11. Moreover, a case where necessary is set to the flag of each region beforehand is assumed here, and the writing of data, the discard of data and others are assumed as user operation.

First, the information processing apparatus 10 performs user operation on the data storage apparatus 20. Subsequently, in a case where the user operation is the writing of data ("Yes" in S12), the region detection unit 111 sets "immediate refresh is unnecessary" to the flag of a region in which the data is written (S13). Meanwhile, in a case where the user operation is the discard of data ("No" in S12), the region detection unit 111 sets "refresh is permanently unnecessary" to the flag of a region in which the data is discarded (S15). The flow of operation to update the refresh table 121 has been described above with reference to FIG. 11.

Figure 12:
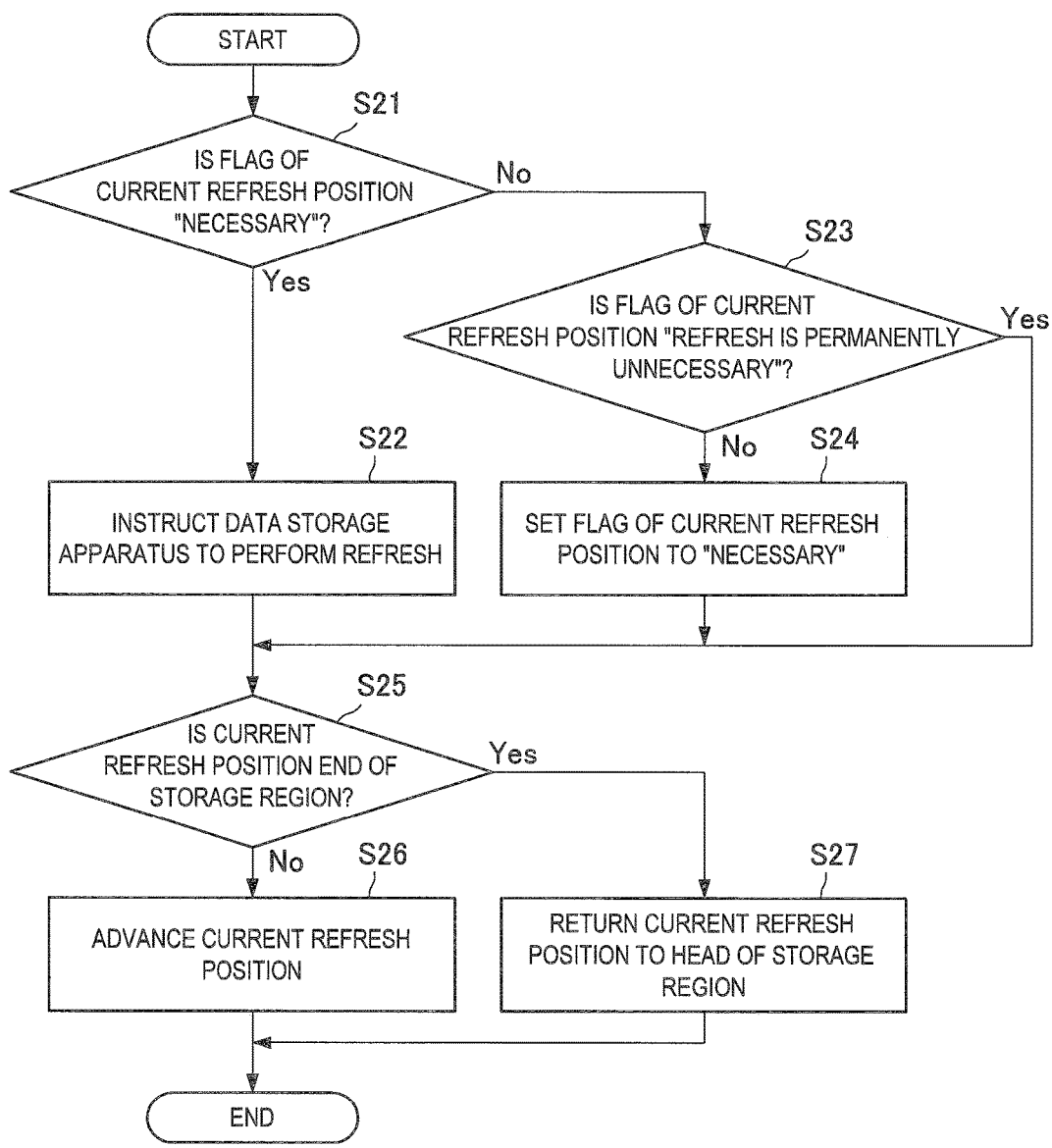
FIG. 12 is a flowchart illustrating an operation example of refresh processing.

Subsequently, the flow of operation of refresh processing is described. FIG. 12 is a flowchart illustrating an operation example of refresh processing. Here, the flow of operation illustrated in FIG. 12 merely shows one example of the operation of the refresh processing. Therefore, the flow of the operation of the refresh processing is not limited to the example illustrated in FIG. 12. The refresh processing may be performed every predetermined period as described above, but the timing at which the refresh processing is performed is not especially limited. Here, the storage control unit 113 can cause the current refresh position to be stored. For example, the storage control unit 113 only has to cause the RAM 120 to store the current refresh position.

First, in a case where the flag of the current refresh position is necessary ("Yes" in S21), the refresh processing unit 112 instructs the data storage apparatus 20 to perform refresh (S22), and it proceeds to S25. The data storage apparatus 20 performs refresh on the region of the current refresh position according to the refresh instruction. Meanwhile, in the refresh processing unit 112, in a case where the flag of the current refresh position is not necessary ("No" in S21), it proceeds to S23.

In a case where the flag of the current refresh position is "refresh is permanently unnecessary" ("Yes" in S23), the refresh processing unit 112 proceeds to S25. Meanwhile, in a case where the flag of the current refresh position is not "refresh is permanently unnecessary" (in a case where the flag of the current refresh position is "immediate refresh is unnecessary") ("No" in S23), the refresh processing unit 112 sets necessary to the flag of the current refresh position (S24), and it proceeds to S25.

Subsequently, in a case where the current refresh position is the end of a storage region ("Yes" in S25), the refresh processing unit 112 returns the current refresh position to the head of the storage region (S27). After the current refresh position returns to the head of the storage region, the operation S21 and the subsequent operations may be performed again. Meanwhile, in a case where the current refresh position is not the end of the storage region ("No" in S25), the refresh processing unit 112 advances the current refresh position (S26). After the current refresh position is advanced, the operation S21 and the subsequent operations may be performed again. The flow of operation of refresh processing has been described above with reference to FIG. 12.

A case where a region that satisfies a predetermined condition includes at least a region specified by user operation has been described above as an example. However, the region that satisfies the predetermined condition is not limited to this example. For example, there is a case where refresh does not have to be performed on a region in which reconfigurable data exists among storage regions of the data storage apparatus 20. It is because, even if the refresh is not performed on the region in which the reconfigurable data exists and the reconfigurable data changes, the data can be restored. Therefore, the region that satisfies the predetermined condition may include at least the region in which the reconfigurable data exists.

The reconfigurable data is not especially limited. For example, the reconfigurable data may include at least cache data reproduced from master data. It is because, even if a region in which the cache data exists is not refreshed and the cache data changes, the cache data can be reconfigured from the master data. For example, the region in which the cache data exists is understood by file system Fs.

Moreover, a case is assumed where it is not inconvenient for the user even if the reconfigurable data changes, and therefore refresh does not have to be permanently performed on a region in which the reconfigurable data exists. Therefore, the refresh processing unit 112 may skip refresh with respect to the region in which the reconfigurable data exits, and may not set information showing that the refresh is necessary to a flag associated with the region in which the reconfigurable data exists.

Moreover, for example, there is a case where refresh does not have to be performed on a region in which reacquisition-possible data exists among storage regions of the data storage apparatus 20. It is because, even if the refresh is not performed on the region in which the reacquisition-possible data exists and the reacquisition-possible data changes, the data can be restored. Therefore, the region that satisfies the predetermined condition may include at least the region in which the reacquisition-possible data exists.

The reacquisition-possible data is not especially limited. For example, the reacquisition-possible data may include at least EPG data provided from an Electronic Program Guide (EPG) server. It is because, even if a region in which the EPG data exists is not refreshed and the EPG data changes, the EPG data can be reacquired from the EPG server. For example, the region in which the EPG data exists is understood by file system Fs.

Moreover, a case is assumed where it is not inconvenient for the user even if the reacquisition-possible data changes, and therefore refresh does not have to be permanently performed on a region in which the reacquisition-possible data exists. Therefore, the refresh processing unit 112 may skip refresh with respect to the region in which the reacquisition-possible data exits, and may not set information showing that the refresh is necessary to a flag associated with the region in which the reacquisition-possible data exists.

Figure 13:
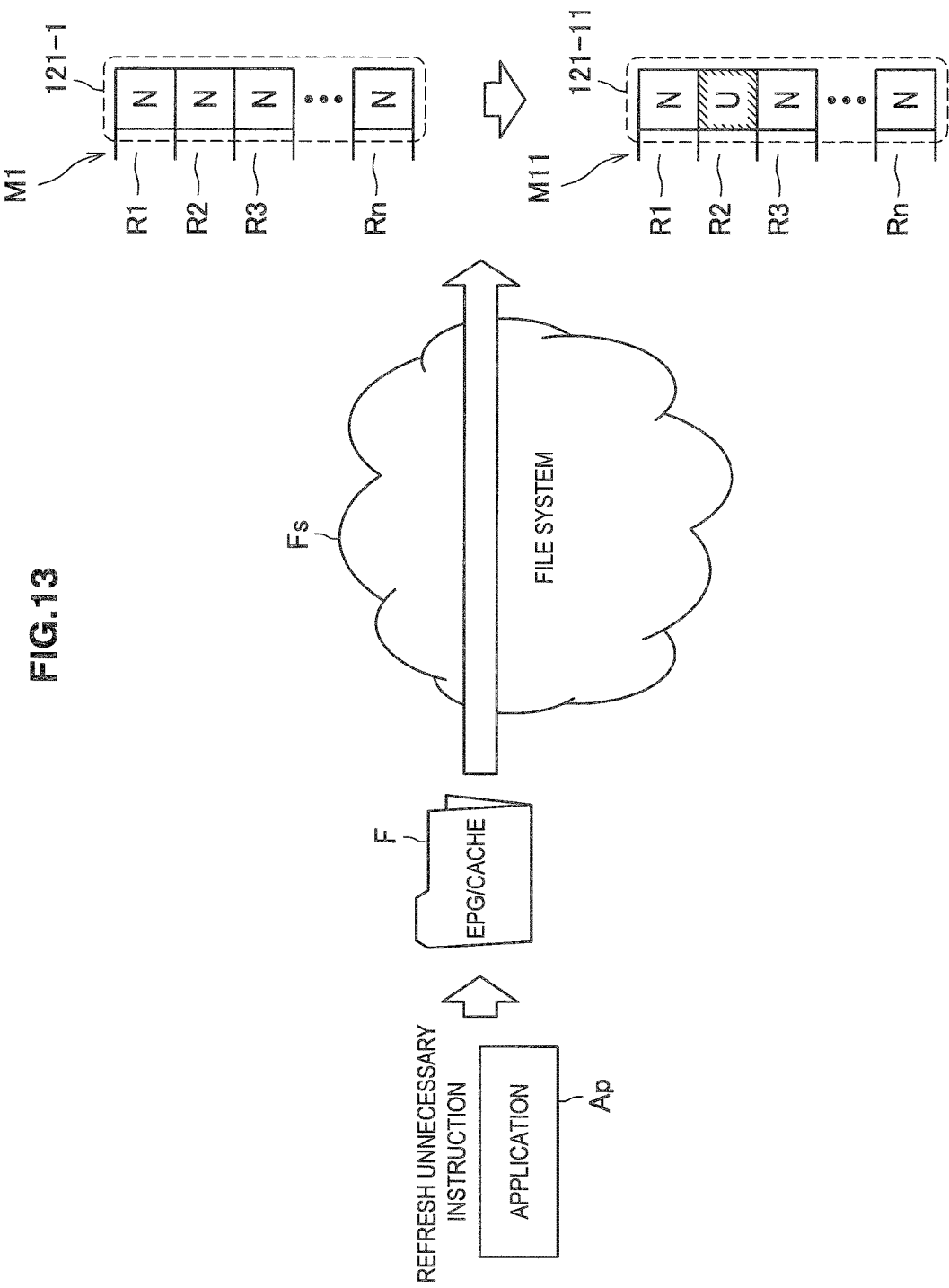
FIG. 13 is a diagram to describe an example of skipping the refresh of a region in which reconfigurable data exists or a region in which reacquisition-possible data exists.

A concrete example is described with reference to FIG. 13. FIG. 13 is a diagram to describe an example of skipping the refresh of a region in which reconfigurable data exists or a region in which reacquisition-possible data exists. Referring to FIG. 13, the time change of storage region M (storage regions M1 and M11) is illustrated, and the time change of the refresh table 121 (refresh tables 121-1 and 121-11) is illustrated. Each data is written in each of regions R1 to Rn included in storage region M1. Moreover, referring to the refresh table 121-1, information showing that the refresh is necessary is set to the flag associated with each of regions R1 to Rn.

In this case, as illustrated in storage region M11, when the writing of file F (file in which EPG data or cache data is described) with respect to region R2 is caused by user operation, region R2 in which file F exists is understood by file system Fs. Subsequently, when a refresh unnecessary instruction in which file F is specified from application Ap executed in the information processing apparatus 10 is given to file system Fs, region R2 in which file F exists is notified from file system Fs and detected by the region detection unit 111.

When region R2 in which file F exists is detected by the region detection unit 111, as illustrated in FIG. 13, the region detection unit 111 sets information showing that the refresh is unnecessary (information showing that permanently refresh is unnecessary) to a flag associated with data writing region R2. An example of skipping the refresh of a region in which reconfigurable data exists or a region in which reacquisition-possible data exists has been described above with reference to FIG. 13.

Here, the storage control unit 113 has a function to cause the refresh table 121 to be stored, but the place in which the refresh table 121 is stored is not limited. For example, the storage control unit 113 may store the refresh table 121 in the RAM 120. Moreover, the storage control unit 113 may store the refresh table 121 in the data storage apparatus 20. Then, it becomes possible to restore the refresh table 121 from the data storage apparatus 20.

Figure 14:
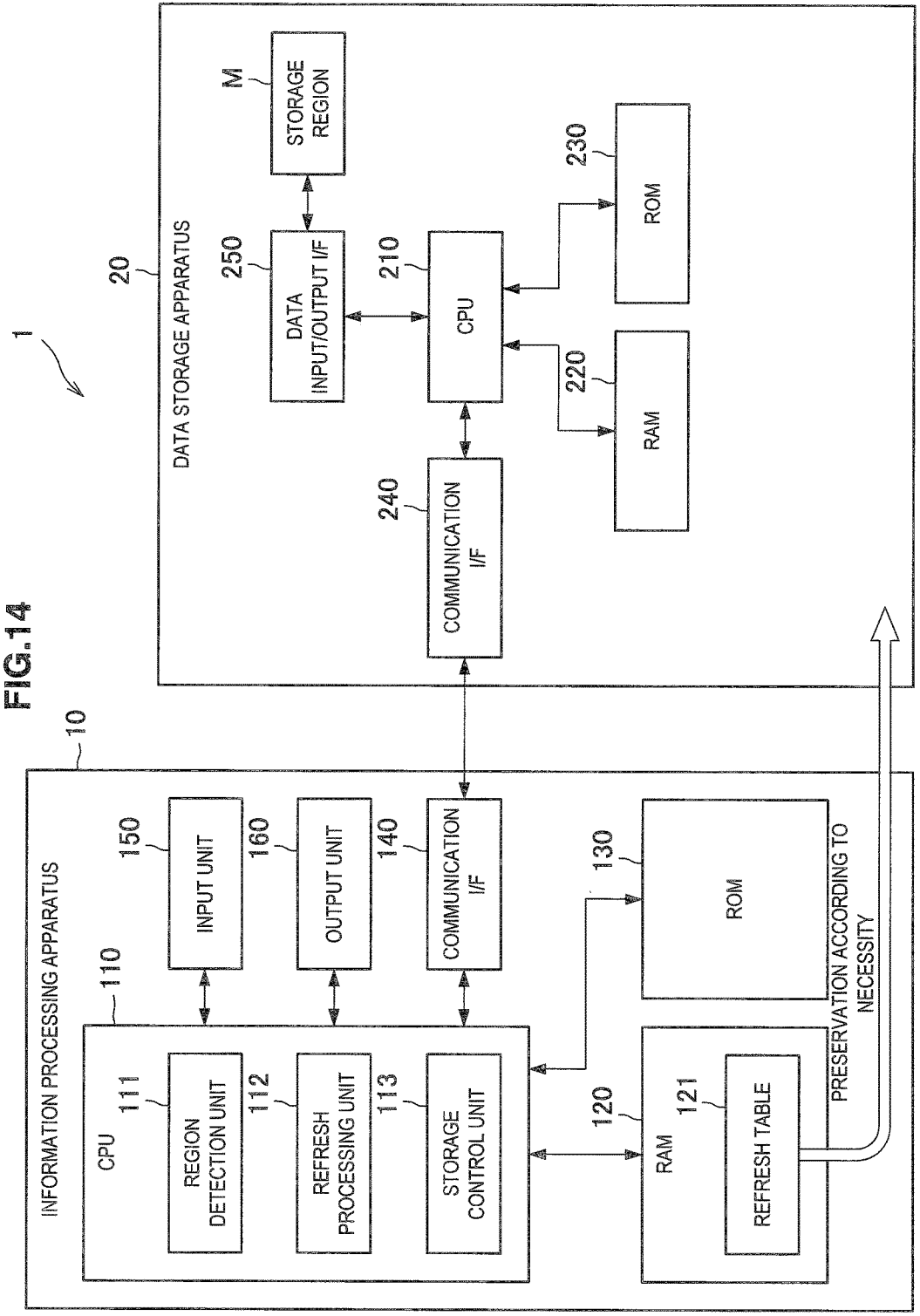
FIG. 14 is a diagram to describe an example of storing a refresh table in a data storage apparatus.

When storing the refresh table 121 in the data storage apparatus 20, the storage control unit 113 may reproduce or move the refresh table 121 from the RAM 120 to the data storage apparatus 20. FIG. 14 is a diagram to describe an example of storing the refresh table 121 in the data storage apparatus 20. As illustrated in FIG. 14, the storage control unit 113 may preserve (or may store) the refresh table 121 in storage region M of the data storage apparatus 20 according to the necessity.

Here, the timing at which the refresh table 121 is stored in the data storage apparatus 20 is not especially limited. For example, the storage control unit 113 may store the refresh table 121 in the data storage apparatus 20 every predetermined time. Alternatively, the storage control unit 113 may store the refresh table 121 in the data storage apparatus 20 before the power source applied to the information processing apparatus 10 is disconnected. It is because the refresh table 121 stored in the RAM 120 is lost by the disconnection of the power source. Alternatively, the storage control unit 113 may store the refresh table 121 in the data storage apparatus 20 at the idle state of the information processing apparatus 10.

Figure 15:
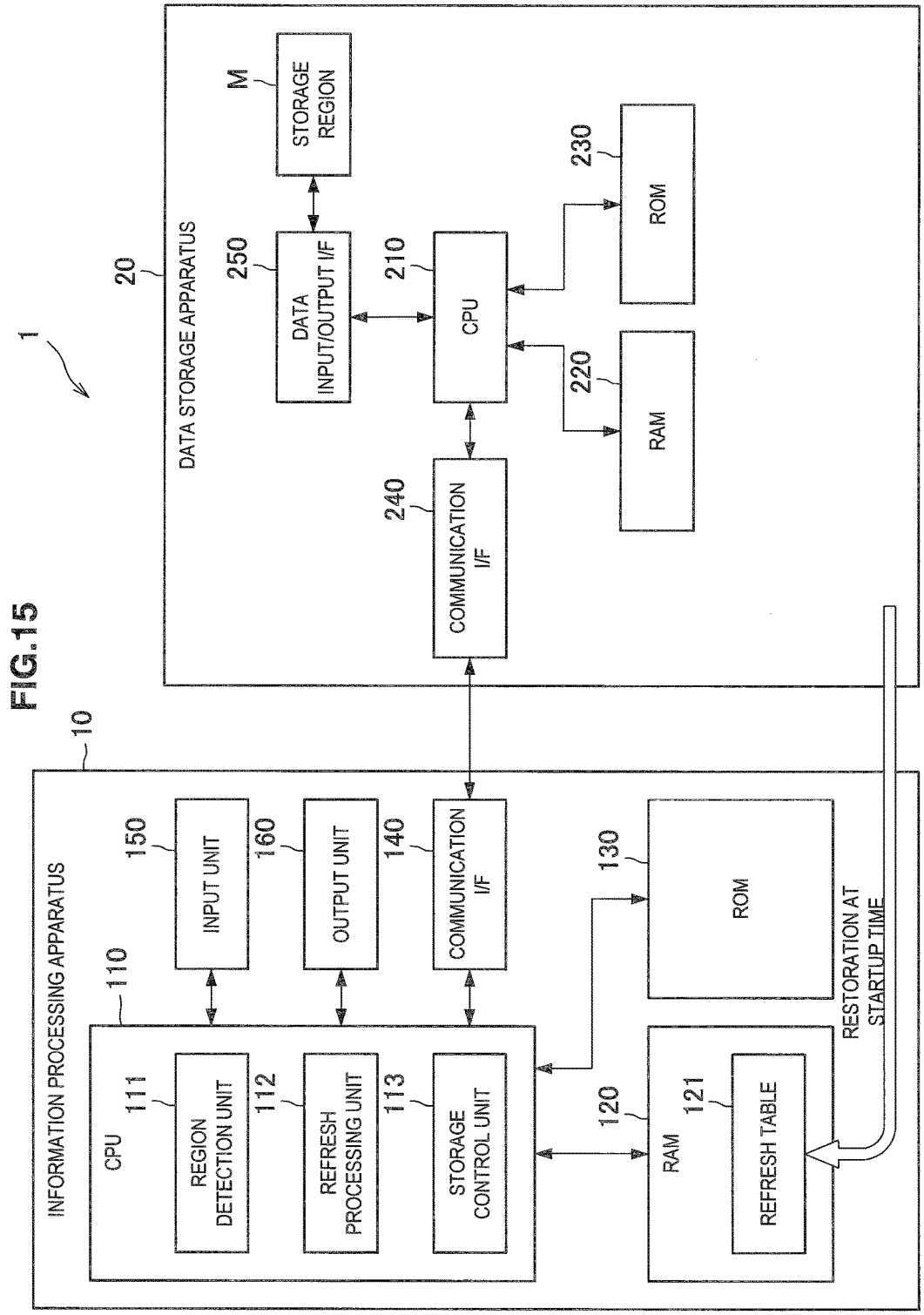
FIG. 15 is a diagram to describe an example of storing a refresh table in an information processing apparatus.

Moreover, when the power source is applied to the information processing apparatus 10 and the information processing apparatus 10 is started, the storage control unit 113 may restore the refresh table 121 from the data storage apparatus 20 to the information processing apparatus 10. FIG. 15 is a diagram to describe an example of storing the refresh table 121 in the information processing apparatus 10. As illustrated in FIG. 15, when the information processing apparatus 10 is started, the storage control unit 113 may restore (or may store) the refresh table 121 from storage region M of the data storage apparatus 20 to the RAM 120. Details of function of the information processing system 1 according to an embodiment of the present disclosure have been described above.

<4.Hardware Configuration Example of Information Processing Apparatus>

Figure 16:
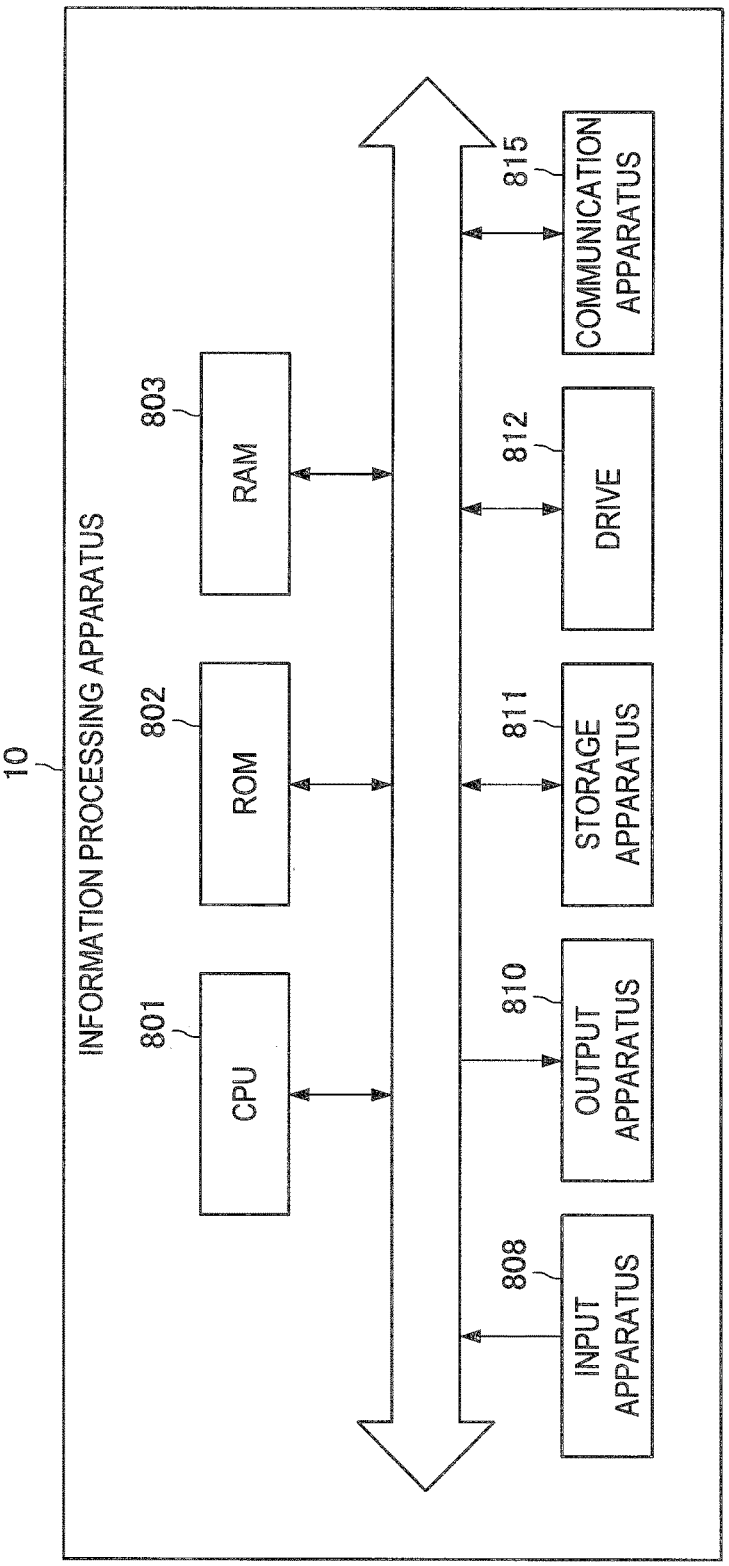
FIG. 16 is a diagram illustrating a hardware configuration example of an information processing apparatus according to the embodiment.

Subsequently, a hardware configuration example of the information processing apparatus 10 according to an embodiment of the present disclosure is described. FIG. 16 is a diagram illustrating a hardware configuration example of the information processing apparatus 10 according to the embodiment of the present disclosure. However, the hardware configuration example illustrated in FIG. 16 merely shows one example of the hardware configuration of the information processing apparatus 10. Therefore, the hardware configuration of the information processing apparatus 10 is not limited to the example illustrated in FIG. 16.

As illustrated in FIG. 16, the information processing apparatus 10 includes a central processing unit (CPU) 801, a read only memory (ROM) 802, a random access memory (RAM) 803, an input apparatus 808, an output apparatus 810, a storage apparatus 811, a drive 812 and a communication apparatus 815.

The CPU 801 functions as an operation processing apparatus and a control apparatus, and controls the entire operation in the information processing apparatus 10 according to various programs. Moreover, the CPU 801 may be a microprocessor. The ROM 802 stores, for example, a program or operation parameter used by the CPU 801. The RAM 803 temporarily stores, for example, a program used in the execution of the CPU 801 or a parameter that appropriately changes in the execution. These are mutually connected by a host bus including a CPU bus and the like.

The input apparatus 808 includes an operation unit to input information by the user, such as a mouse, a keyboard, a touch panel, a button (such as a power button), a microphone, a switch, a dial and a lever, and an input control circuit that generates an input signal on the basis of input by the user and outputs the input signal to the CPU 801. The user of the information processing apparatus 10 can input various kinds of data or instruct processing operation to the information processing apparatus 10 by operating the relevant input apparatus 808. Here, the positions in which these operation units are installed are not especially limited. For example, the relevant operation unit may be installed in the chassis side surface of the information processing apparatus 10 or may be installed on the same surface as a surface in which a display is installed.

For example, the output apparatus 810 may include a display apparatus such as a liquid crystal display (LCD), an organic light emitting diode (OLED) and a lamp. In addition, the output apparatus 810 may include an audio output apparatus such as a speaker and headphones. For example, the display apparatus displays a photographed image and a generated image. Meanwhile, the audio output apparatus may convert audio data or the like into audio and output the audio.

The storage apparatus 811 is an apparatus for data storage which is configured as an example of a storage unit of the information processing apparatus 10. The storage apparatus 811 may include a storage medium, a recording apparatus that records data in the storage medium, a readout apparatus that reads out the data from the storage medium, and a deletion apparatus that deletes the data recorded in the storage medium. This storage apparatus 811 stores a program executed by the CPU 801 and various kinds of data.

The drive 812 is a reader/writer for a storage medium and is internally or externally attached to the information processing apparatus 10. The drive 812 reads out information recorded in a removable storage medium such as an attached magnetic disk, an optical disk, a magneto-optical disk and a semiconductor memory, and outputs the information to the RAM 803. Moreover, the drive 812 can write information in the removable storage medium.

The communication apparatus 815 performs communication with an external apparatus through a network (or in a direct manner). The communication apparatus 815 may be an interface for radio communication, and, for example, may include a communication antenna, a radio frequency (RF) circuit and a baseband processor. Specific examples of the interface for radio communication include a communication unit such as a modem supporting a communication scheme like code division multiple access (CDMA), wideband code division multiple access (W-CDMA), long term evolution (LTE) and wireless fidelity (Wi-fi) (registered trademark).

Moreover, the communication apparatus 815 may be an interface for wire communication, and, for example, may include a connection terminal, a transmission circuit and a circuit for other communication processing. Moreover, the CPU 801 and the communication apparatus 815 may be formed by one chip or may be realized as separate devices. Moreover, there is no illustration in FIG. 16, but, for example, the information processing apparatus 10 may be driven by power supplied from a power source such as a rechargeable battery, and the relevant power source may be detachably formed to the information processing apparatus 10. A hardware configuration example of the information processing apparatus 10 according to an embodiment of the present disclosure has been described above.

<5. Conclusion>

As described above, according to an embodiment of the present disclosure, there is provided the information processing apparatus 10 including: the region detection unit 111 that detects a region that satisfies a predetermined condition among regions R1 to Rn included in the data storage apparatus 20; and the refresh processing unit 112 that skips refresh with respect to the region that satisfies the predetermined condition when performing refresh processing on regions R1 to Rn. According to this configuration, it becomes possible to perform refresh processing on the data storage apparatus 20 more efficiently.

A preferred embodiment of the present disclosure has been described above in detail with reference to the accompanying drawings, but the technical scope of the present disclosure is not limited to this example. It is clear that a person who has normal knowledge in the technical field of the present disclosure can conceive of various change examples or correction examples within the range of the technical idea described in the claims, and it is naturally understood that these examples belong to the technical scope of the present disclosure.

Moreover, for example, the operation of the information processing apparatus 10 does not have to be sequentially performed in the chronological order described in a flowchart. For example, the operation of the information processing apparatus 10 may be performed in different order from the order described in the flowchart or at least part of the operation described in the flowchart may be performed in parallel.

Moreover, it is possible to create a program that causes hardware such as a CPU, a ROM and a RAM incorporated in a computer to fulfill a function equivalent to the function of the information processing apparatus 10 described above. Moreover, a computer-readable recording medium that records the relevant program may be provided.

Moreover, the effects described in this specification are explanatory or exemplary and are not limited. That is, the technique according to an embodiment of the present disclosure may provide other effects that are clear for those skilled in the art from this specification, together with the above-mentioned effects or instead of the above-mentioned effects.

It should be understood by those skilled in the art that various modifications, combinations, sub-combinations and alterations may occur depending on design requirements and other factors insofar as they are within the scope of the appended claims or the equivalents thereof.

Additionally, the present technology may also be configured as below.

(1) An information processing apparatus including:
    a region detection unit configured to detect a region that satisfies a predetermined condition among a plurality of regions included in a data storage apparatus; and
    a refresh processing unit configured to skip refresh with respect to the region that satisfies the predetermined condition when performing refresh processing on the plurality of regions.

(2) The information processing apparatus according to (1), wherein the region detection unit sets information showing that the refresh is unnecessary, to refresh necessity/ unnecessity information associated with the region that satisfies the predetermined condition, and
wherein the refresh processing unit skips the refresh with respect to the region associated with the information showing that the refresh is unnecessary among the plurality of regions.

(3) The information processing apparatus according to (1) or (2),
wherein the region that satisfies the predetermined condition includes at least a region specified by user operation.

(4) The information processing apparatus according to (3),
wherein the region specified by the user operation includes at least a data writing region among the plurality of regions.

(5) The information processing apparatus according to (4),
wherein the refresh processing unit skips refresh with respect to the data writing region and sets information showing that the refresh is necessary, to refresh necessity/unnecessity information associated with the data writing region.

(6) The information processing apparatus according to any one of (3) to (5),
wherein the region specified by the user operation includes at least a data discard region among the plurality of regions.

(7) The information processing apparatus according to (6),
wherein the refresh processing unit skips refresh with respect to the data discard region and does not set information showing that the refresh is necessary, to refresh necessity/unnecessity information associated with the data discard region.

(8) The information processing apparatus according to any one of (3) to (7),
wherein the region specified by the user operation includes at least a data readout region among the plurality of regions.

(9) The information processing apparatus according to (8),
wherein the refresh processing unit skips refresh with respect to the data readout region and sets information showing that the refresh is necessary, to refresh necessity/unnecessity information associated with the data readout region.

(10) The information processing apparatus according to any one of (3) to (9),
wherein the region that satisfies the predetermined condition includes at least a region in which reconfigurable data exists.

(11) The information processing apparatus according to (10),
wherein the reconfigurable data includes at least cache data reproduced from master data.

(12) The information processing apparatus according to any one of (3) to (11),
wherein the region that satisfies the predetermined condition includes at least a region in which reacquisition-possible data exists.

(13) The information processing apparatus according to (12),
wherein the reacquisition-possible data includes at least EPG data provided from an EPG server.

(14) The information processing apparatus according to any one of (1) to (13), further including:
a storage control unit configured to cause refresh necessity/unnecessity information associated with each of the plurality of regions to be stored as a refresh table.

(15) The information processing apparatus according to (14),
wherein the storage control unit causes the refresh table to be stored in RAM.

(16) The information processing apparatus according to (14) or (15),
wherein the storage control unit causes the refresh table to be stored in the data storage apparatus.

(17) The information processing apparatus according to (16),
wherein the storage control unit causes the refresh table to be stored in the data storage apparatus every predetermined time.

(18) The information processing apparatus according to (16),
wherein the storage control unit causes the refresh table to be stored in the data storage apparatus before a power source is disconnected.

(19) The information processing apparatus according to any one of (14) to (18),
wherein the storage control unit causes a current refresh position to be stored.

(20) An information processing method including:
detecting a region that satisfies a predetermined condition among a plurality of regions included in a data storage apparatus; and
skipping, by a processor, refresh with respect to the region that satisfies the predetermined condition when performing refresh processing on the plurality of regions.

(21) A non-transitory computer-readable recording medium having a program recorded therein, the program causing a computer to function as an information processing apparatus including:
a region detection unit configured to detect a region that satisfies a predetermined condition among a plurality of regions included in a data storage apparatus; and
a refresh processing unit configured to skip refresh with respect to the region that satisfies the predetermined condition when performing refresh processing on the plurality of regions.

What is claimed is:

1. An information processing apparatus, comprising:
a region detection unit configured to:
detect, based on a user operation, a first region among a plurality of regions of a data storage apparatus; and
associate first information with the first region; and
a refresh processing unit configured to:
skip, based on the first information, refresh of the first region in a refresh process on the plurality of regions; and
generate second information based on the first information,
wherein in a case the first information corresponds to a first refresh status, the second information corresponds to a third refresh status,
wherein in a case the first information corresponds to a second refresh status, the second information corresponds to the second refresh status, and
wherein each of the first refresh status, the second refresh status, and the third refresh status indicates a different type of necessity of the refresh process.

2. The information processing apparatus according to claim 1, wherein the first information indicates that the refresh is unnecessary to the first region.

3. The information processing apparatus according to claim 1, wherein the first region includes a data writing region among the plurality of regions.

4. The information processing apparatus according to claim 3, wherein the refresh processing unit is further configured to:
skip the refresh with respect to the data writing region, based on the first information; and
generate the second information based on the first information such that the second information corresponds to the third refresh status,
wherein the third refresh status shows that the refresh is necessary to the data writing region.

5. The information processing apparatus according to claim 1, wherein the first region includes a data discard region among the plurality of regions.

6. The information processing apparatus according to claim 5, wherein the refresh processing unit is further configured to:
skip the refresh with respect to the data discard region, based on the first information; and
generate the second information based on the first information such that the second information shows that the refresh is unnecessary to the data discard region.

7. The information processing apparatus according to claim 1, wherein the first region includes a data readout region among the plurality of regions.

8. The information processing apparatus according to claim 7, wherein the refresh processing unit is further configured to:
skip the refresh with respect to the data readout region, based on the first information; and
generate the second information based on the first information such that the second information corresponds to the third refresh status,
wherein the third refresh status shows that the refresh is necessary to the data readout region.

9. The information processing apparatus according to claim 1,
wherein the region detection unit is further configured to detect a second region among the plurality of regions, and
wherein the second region stores reacquisition-possible data.

10. The information processing apparatus according to claim 9, wherein the reacquisition-possible data includes at least Electronic Program Guide (EPG) data received from an EPG server.

11. The information processing apparatus according to claim 1, further comprising a storage control unit configured to store refresh information, associated with each of the plurality of regions, as a refresh table.

12. The information processing apparatus according to claim 11, wherein the storage control unit is further configured to store the refresh table in a random access memory (RAM).

13. The information processing apparatus according to claim 11, wherein the storage control unit is further configured to store the refresh table in the data storage apparatus.

14. The information processing apparatus according to claim 13, wherein the storage control unit is further configured to periodically store the refresh table in the data storage apparatus at a first time period.

15. The information processing apparatus according to claim 13, wherein the storage control unit is further configured to store the refresh table in the data storage apparatus based on disconnection of a power source of the data storage apparatus.

16. The information processing apparatus according to claim 11, wherein the storage control unit is further configured to store a current refresh position.

17. An information processing method, comprising:
detecting, based on a user operation, a region among a plurality of regions of a data storage apparatus;
associating first information with the region;
skipping, based on the first information, refresh of the region, in a refresh processing on the plurality of regions; and
generating second information based on the first information,
wherein in a case the first information corresponds to a first refresh status, the second information corresponds to a third refresh status,
wherein in a case the first information corresponds to a second refresh status, the second information corresponds to the second refresh status, and
wherein each of the first refresh status, the second refresh status, and the third refresh status indicates a different type of necessity of the refresh processing.

18. A non-transitory computer-readable medium having stored thereon computer-executable instructions that, when executed by a processor, cause a computer to execute operations, the operations comprising:
detecting, based on a user operation, a region among a plurality of regions of a data storage apparatus;
associating first information with the region;
skipping, based on the first information, refresh of the region, in a refresh processing on the plurality of regions; and
generating second information based on the first information,
wherein in a case the first information corresponds to a first refresh status, the second information corresponds to a third refresh status,
wherein in a case the first information corresponds to a second refresh status, the second information corresponds to the second refresh status, and
wherein each of the first refresh status, the second refresh status, and the third refresh status indicates a different type of necessity of the refresh processing.

* * * * *